Jan. 20, 1959 G. SALMET 2,870,330
HIGH FREQUENCY OSCILLATOR CONTROL CIRCUIT ARRANGEMENT
Filed Feb. 18, 1953
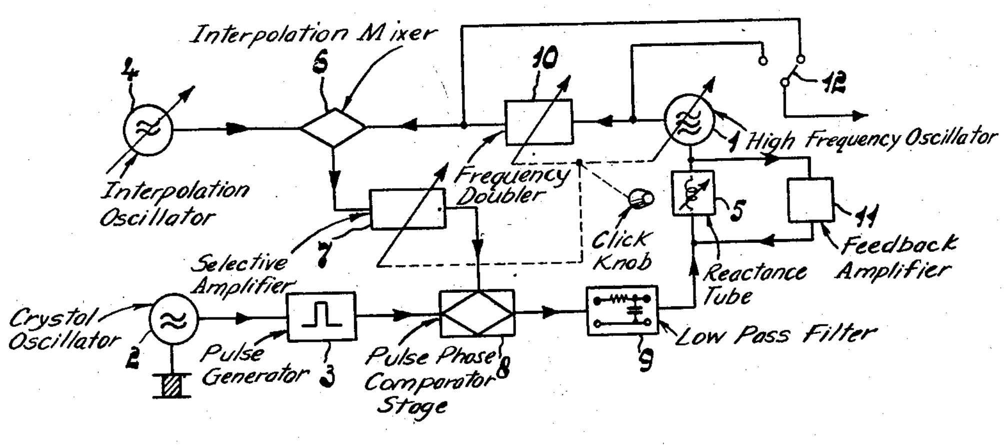
INVENTOR
GASTON SALMET
BY [signature]
AGENT United States Patent Office 2,870,330

Patented Jan. 20, 1959

2,870,330

HIGH FREQUENCY OSCILLATOR CONTROL CIRCUIT ARRANGEMENT

Gaston Salmet, Courbevoie (Seine), France, assignor, by mesne assignments, to North American Philips Company, Inc., New York, N. Y., a corporation of Delaware Application February 18, 1953, Serial No. 337,592

Claims priority, application France February 21, 1952

6 Claims. (Cl. 250—36)

The present invention relates to a high frequency oscillator control circuit arrangement. More particularly, the invention relates to a circuit arrangement comprising a high-frequency oscillator adapted to be tuned in coarse steps and in smaller interpolation steps and a frequency controller coupled to the high-frequency oscillator for the purpose of automatic frequency control (AFC) of the high-frequency oscillator according to stabilizing pulses and the voltage of an interpolation oscillator, the frequency controller being controlled by an AFC-voltage taken from a control voltage generator.

According to the invention, the control voltage generator of such a circuit arrangement includes a first mixing stage (interpolation mixer) controlled by voltages taken from the high-frequency and interpolation oscillators. The output voltage of said interpolation mixer is supplied, via a selective amplifier adapted to be tuned to various harmonics of the stabilizing pulse frequency, to a normally inoperative second mixer (pulse mixer) to which the stabilizing pulses are supplied for the purpose of periodic disruption. The output of the second or pulse mixer is coupled to the frequency controller via a low-pass filter which constitutes the output circuit of the control voltage generator.

It should be noted that arrangements of the kind described in the opening part were suggested before, the control voltage generator including a first mixer controlled by the voltage of the high-frequency oscillator and the stabilizing pulses and the output voltage of the first mixer being supplied via a selective amplifier adapted to be adjusted in interpolation steps to a second mixer to which the interpolation oscillator is also connected. For satisfactory operation of the arrangement the construction of the mixers and the intermediate selective amplifier has to satisfy in practice exacting requirements in order that from the extensive frequency spectrum of input frequencies, first-order mixing products and further mixing and deformation products occurring at the output of the first mixer, only the required mixing product may reach the second mixer. In addition, in these devices the high-frequency oscillator cannot be stabilized without further expedients to a frequency situated mid-way in successive spectrum components of the stabilizing pulses.

The circuit arrangement of the present invention reduces or even removes the above-mentioned difficulties.

According to a preferred embodiment of the arrangement according to the invention, the high-frequency oscillator is connected to the interpolation mixer of the control voltage generator via a frequency multiplying stage, preferably a frequency doubler, and the output voltage of the arrangement may be taken at will directly either from the high-frequency oscillator or from the output circuit of the frequency multiplying stage.

The invention will now be described with reference to the accompanying drawing, in which a preferred embodiment of the circuit arrangement of the present invention, in block diagram form. The frequency values mentioned in the description of the embodiment illustrated are given by way of illustration only and are not limitative.

Referring to the drawing, 1 designates a high-frequency oscillator adapted to be adjusted, say, from 1.5 to 2.5 mc./s. in coarse steps of 100 kc./s. and interpolation steps of 10 kc./s. The desired frequency is invariably required to be stabilized according to harmonics of stabilizing pulses having a repetition frequency of 200 kc./s. and originating from a pulse generator 3 controlled by a crystal oscillator 2 and the sinusoidal output voltage of an interpolation oscillator 4 adapted to be tuned for example by means of a click-knob mechanism in steps of 20 kc./s. from 100 to 300 kc./s.

Coupled to the frequency-determining circuit of the high-frequency oscillator 1 is a frequency controller 5 constituted for example by a reactance tube controlled by an AFC-voltage.

The required AFC-voltage is produced by means of a control voltage generator comprising in succession an interpolation mixer 6, a selective amplifier 7 adapted to be tuned in coarse steps, a pulse mixer 8 and a low-pass filter 9.

The interpolation mixer 6 of the control voltage generator is supplied with two sinusoidal voltages, that is, the output voltage of interpolation oscillator 4 and a voltage originating from the high-frequency oscillator 1 which is frequency doubled by means of a frequency doubler 10. If, for example, the high-frequency oscillator 1 is required to be stabilized at 1890 kc./s., interpolation oscillator 4 is adjusted with great accuracy to a frequency of 180 kc./s. and oscillator 1 is adjusted to about the required frequency in a manner described hereinafter. Thus a frequency of about 3780 kc./s. is supplied to the interpolation mixer 6 via the frequency doubler 10. In the output circuit of the interpolation mixer 6 is thus set up a limited number of frequencies; that is, to begin with, only the supplied frequencies of about 180 and about 3780 kc./s. respectively and their combination frequencies, in this case about $3780\pm180$ kc./s. One of the combination frequencies, for example, in the numerical example chosen the difference frequency of about $3780-180=3600$ kc./s., is selected by means of the selective amplifier 7 and supplied to pulse mixer 8. The undesired frequencies among the said output frequencies of the interpolation mixer 6, constructed, for example, as a push-pull mixer, the deformation products which so far have not been allowed for and the higher order mixing frequencies, are located at such a large frequency distance from the frequency to be selected that the desired selection does not require the selective amplifier 7 to satisfy requirements inconvenient in practice. The selective amplifier 7 may be constructed as a two-step amplifier having band-pass filter coupling between the tubes.

The selected difference frequency thus controls the pulse mixer 8 which is normally inoperative and which is periodically made operative or released, only by the stabilizing pulses produced by the pulse generator 3 and having a repetition frequency of 200 kc./s.

As known per se, for example, from U. S. Patent 2,574,482, issued November 13, 1951, to Hugenholtz, in the output circuit of such a pulse mixer, as soon as it is supplied with a voltage the frequency of which substantially corresponds to a higher harmonic of the stabilizing pulses, there is set up after filtering by means of a low-pass filter a control voltage adapted to act as an AFC-voltage, this voltage being supplied in the embodiment described via the low-pass filter 9 at a cut-off frequency of, say, 10 kc./s. to the frequency controller 5 of the high-frequency oscillator 1. The AFC-voltage brings about "catching" and subsequent stabilization of the high-frequency oscillator 1 at the desired frequency of 1890 kc./s. in accordance with the value of the stable frequencies of the oscillators 2 and 4.

The selective amplifier 7 is adapted to be tuned in coarse steps (200 kc./s.) to frequencies equal to the higher harmonics of the pulse repeating freqeuncy which are required to be used for stabilization.

In order to cause the AFC-circuit to "catch" and stabilize the high frequency oscillator frequency the latter must be inserted in the reduced catching range (for example 20 kc./s.) of the AFC-circuit. For this purpose, the high-frequency oscillator 1 may be tuned initially with an accuracy of ±10 kc./s. to the desired frequency by manual adjustment, or adjustment by means of click knob mechanism, but the adjusting accuracy required in this case becomes substantially more inconvenient with increasing oscillator frequency.

It is therefore more convenient to tune the high-frequency oscillator 1 only in coarse steps, in the present case of 100 kc./s., and to use at the same time a searching voltage generator known per se and only operative in the absence of stabilization. In this case, the initial tuning need only be effected in coarse steps with such accuracy that starting with the initially adjusted frequency the oscillator frequency explores slowly (for example in about ⅕ to 1/25 second) the frequency range of the selected coarse step by means of the searching voltage generator. As soon as in this case the oscillator frequency finds its way within the catching range for the desired frequency, which is determined by tuning the intermediate frequency amplifier and the interpolation oscillator, it catches the AFC-circuit and stabilization occurs and the searching voltage generator becomes inoperative.

For the construction of a searching voltage generator which is only operative in the absence of stabilization, exploring circuits of the type described in French Patent 956,079 may be used. This French patent corresponds to U. S. Patent No. 2,572,343 to Hugenholtz, issued October 23, 1951. Thus, for example, in the embodiment illustrated the reactance tube 5 is fed back via a supplementary amplifier tube 11. The positive feedback via the feedback tube 11 is compensated when cutting-off the AFC-circuit by its stabilizing properties and thus provides for the searching voltage generator 5 and 11 being automatically rendered inoperative on stabilization.

The principle of utilizing an amplifier and a reactance tube to produce oscillations in the absence of synchronization, is taught in the abovementioned French Patent 956,079 and in the corresponding U. S. Patent 2,572,343 of Hugenholtz.

If desired, the interpolation oscillator which is 4 may be constructed as an oscillator required to be frequency-modulated by a modulation voltage, for the purpose of indirect frequency modulation of the voltage of the high-frequency oscillator 1 and the voltage taken therefrom via the frequency multiplying stage 10.

The output voltage of the circuit arrangement may be derived by means of a switch 12 either from the output circuit of the high-frequency oscillator 1 or from the output circuit of the frequency doubler 10, so as to cover the frequency-range from 1.5 to 2.5 mc./s. in coarse and fine steps of 100 kc./s. and 10 kc./s. respectively and the frequency range of 2.5 to 5 mc./s. in coarse and fine steps of 200 kc./s. and 20 kc./s. respectively.

If desired, a further frequency doubler, which from considerations for stabilizing the control circuit is preferably not included in the AFC-loop 1—10—6—7—8—9—5, may be connected to the frequency doubler 10 to cover the frequency range from 5 to 10 mc./s. in coarse and fine steps of 400 kc./s. and 40 kc./s. respectively.

The tuning members for tuning the high-frequency oscillator 1, those from the frequency multiplying stage (stages) 10 connected thereto and the tuning members of amplifiers 7 can be coupled directly, for example, by the use of a multiple tuning capacitor which is operated by means of a click knob mechanism.

What is claimed is:

1. A circuit arrangement comprising a high-frequency oscillator which is tunable in coarse frequency steps and in smaller frequency interpolation steps, means for producing stabilizing pulses, an interpolation oscillator, control voltage generating means comprising a first mixing stage, a selective amplifier tunable to a plurality of harmonics of the stabilizing pulse frequency and having an input coupled to the output of said first mixing stage, a second mixing stage being normally in the inoperative condition and having an input coupled to the output of said amplifier, a low-pass filter having an input coupled to the output of said second mixing stage, means for applying the high-frequency voltage from said high-frequency oscillator to an input of said first mixing stage, means for applying the voltage from said interpolation oscillator to another input of said first mixing stage whereby said last-mentioned voltage is mixed with said high-frequency voltage to produce a beat voltage at the output of said first mixing stage, means for applying the stabilizing pulses from said stabilizing pulse producing means to another input of said second mixing stage whereby said second mixing stage is periodically released during the occurrences of said stabilizing pulses, and search voltage generating means comprising frequency controlling means having an output circuit coupled to said high-frequency oscillator and having an input circuit, means for coupling the output of said low-pass filter to the input circuit of said frequency controlling means, and positive feedback producing means coupled from the output circuit to the input circuit of said frequency controlling means whereby the frequency of said high-frequency oscillator is varied throughout a frequency range corresponding to substantially one coarse frequency step, said search voltage generating means being operative only in the absence of stabilization of said high-frequency oscillator.

2. A circuit arrangement comprising a high-frequency oscillator which is tunable in coarse frequency steps and in smaller frequency interpolation steps, means for producing stabilizing pulses, an interpolation oscillator, control voltage generating means comprising a first mixing stage, a selective amplifier tunable to a plurality of harmonics of the stabilizing pulse frequency and having an input coupled to the output of said first mixing stage, a second mixing stage being normally in the inoperative condition and having an input coupled to the output of said amplifier, a low-pass filter having an input coupled to the output of said second mixing stage, frequency multiplying means coupled to an input of said first mixing stage, means for applying the high-frequency voltage from said high-frequency oscillator to said frequency multiplying means, means for applying the voltage from said interpolation oscillator to another input of said first mixing stage whereby said last-mentioned voltage is mixed with said high-frequency voltage to produce a beat voltage at the output of said first mixing stage, means for applying the stabilizing pulses from said stabilizing pulse producing means to another input of said second mixing stage whereby said second mixing stage is periodically released during the occurrences of said stabilizing pulses, and search voltage generating means comprising frequency controlling means having an output circuit coupled to said high-frequency oscillator and having an input circuit, means for coupling the output of said low-pass filter to the input circuit of said frequency controlling means, and positive feedback producing means coupled from the output circuit to the input circuit of said frequency controlling means whereby the frequency of said high-frequency oscillator is varied throughout a frequency range corresponding to substantially one coarse frequency step, said search voltage generating means being operative only in the absence of stabilization of said high-frequency oscillator.

3. A circuit arrangement as claimed in claim 2, wherein said frequency multiplying means comprises a frequency doubler.

4. A circuit arrangement comprising a high-frequency oscillator which is tunable in coarse frequency steps and in smaller frequency interpolation steps, said high-frequency oscillator having a tuning member for adjusting said coarse frequency steps, means for producing stabilizing pulses, an interpolation oscillator, control voltage generating means comprising a first mixing stage, a selective amplifier tunable to a plurality of harmonics of the stabilizing pulse frequency and having an input coupled to the output of said first mixing stage, said amplifier having a tuning member for tuning said amplifier to a selected one of said plurality of harmonics, a second mixing stage being normally in the inoperative condition and having an input coupled to the output of said amplifier, a low-pass filter having an input coupled to the output of said second mixing stage, frequency multiplying means coupled to an input of said first mixing stage, means for applying the high-frequency voltage from said high-frequency oscillator to said frequency multiplying means, means for applying the voltage from said interpolation oscillator to another input of said first mixing stage whereby said last-mentioned voltage is mixed with said high-frequency voltage to produce a beat voltage at the output of said first mixing stage, means for applying the stabilizing pulses from said stabilizing pulse producing means to another input of said second mixing stage whereby said second mixing stage is periodically released during the occurrences of said stabilizing pulses, search voltage generating means comprising frequency controlling means having an output circuit coupled to said high-frequency oscillator having an input circuit, means for coupling the output of said low-pass filter to the input circuit of said frequency controlling means, and positive feed-back producing means coupled from the output circuit to the input circuit of said frequency controlling means whereby the frequency of said high-frequency oscillator is varied throughout a frequency range corresponding to substantially one coarse frequency step, said search voltage generating means being operative only in the absence of stabilization of said high-frequency oscillator, and means for intercoupling said tuning members.

5. A circuit arrangement as claimed in claim 4, further comprising a click knob mechanism for adjusting said tuning members.

6. A circuit arrangement comprising a high-frequency oscillator which is tunable in coarse frequency steps and in smaller frequency interpolation steps, means for producing stabilizing pulses, an interpolation oscillator, control voltage generating means comprising a first mixing stage, a selective amplifier tunable to a plurality of harmonics of the stabilizing pulse frequency and having an input coupled to the output of said first mixing stage, a second mixing stage being normally in the inoperative condition and having an input coupled to the output of said amplifier, a low-pass filter having an input coupled to the output of said second mixing stage, frequency multiplying means coupled to an input of said first mixing stage, means for applying the high-frequency voltage from said high-frequency oscillator to said frequency multiplying means, means for applying the voltage from said interpolation oscillator to another input of said first mixing stage whereby said last-mentioned voltage is mixed with said high-frequency voltage to produce a beat voltage at the output of said first mixing stage, means for applying the stabilizing pulses from said stabilizing pulse producing means to another input of said second mixing stage whereby said second mixing stage is periodically released during the occurrences of said stabilizing pulses, search voltage generating means comprising frequency controlling means having an output circuit coupled to said high-frequency oscillator and having an input circuit, means for coupling the output of said low-pass filter to the input circuit of said frequency controlling means, and positive feedback producing means coupled from the output circuit to the input circuit of said frequency controlling means whereby the frequency of said high-frequency oscillator is varied throughout a frequency range corresponding to substantially one coarse frequency step, said search voltage generating means being operative only in the absence of stabilization of said high-frequency oscillator, an output circuit for said circuit arrangement, and means for selectively coupling said output circuit to the output of said high-frequency oscillator and to the output of said frequency multiplying stage.

References Cited in the file of this patent

UNITED STATES PATENTS

| | | |
|---|---|---|
| 2,295,615 | Tucker | Sept. 15, 1942 |
| 2,406,125 | Ziegler | Aug. 20, 1946 |
| 2,438,425 | Vance | Mar. 23, 1948 |
| 2,550,519 | Bataille | Apr. 24, 1951 |
| 2,605,425 | Hugenholtz | July 29, 1952 |
| 2,662,180 | Hugenholtz | Dec. 8, 1953 |
| 2,698,904 | Hugenholtz | Jan. 4, 1955 |
| 2,704,329 | Law | Mar. 15, 1955 |
| 2,706,251 | Russell et al. | Apr. 12, 1955 |